United States Patent [19]

Andrews et al.

[11] Patent Number: 4,893,301
[45] Date of Patent: Jan. 9, 1990

[54] AUTOMATIC CALL DISTRIBUTION (ACD) SWITCHING SYSTEM HAVING DISTRIBUTED PROCESSING CAPABILITY

[75] Inventors: Gerald W. Andrews, Colleyville; William E. Dunnigan, Garland; E. Fletcher Haselton, Irving; William J. Redwood, Coppell, all of Tex.

[73] Assignee: Teknekron Infoswitch Corporation, Fort Worth, Tex.

[21] Appl. No.: 226,229

[22] Filed: Jul. 29, 1988

Related U.S. Application Data

[63] Continuation-in-part of Ser. No. 211,589, Jun. 27, 1988, Pat. No. 4,840,570.

[51] Int. Cl.⁴ ............................................. H04Q 11/04
[52] U.S. Cl. .................................... 370/58.2; 379/309
[58] Field of Search .................. 370/58, 62; 379/309, 379/308

[56] References Cited

U.S. PATENT DOCUMENTS

| | | | |
|---|---|---|---|
| 4,451,704 | 5/1984 | Winkelman | 379/309 |
| 4,451,705 | 5/1984 | Burke et al. | 379/309 |
| 4,627,046 | 2/1986 | Bellamy | 370/58 |
| 4,720,854 | 1/1988 | Sand | 370/58 |

OTHER PUBLICATIONS

"Automatic Call Distribution System-ASDP162" by Brown et al, Telecommunication Journal of Australia, vol. 29, No. 3, 1979, pp. 245-255.

Primary Examiner—Douglas W. Olms
Attorney, Agent, or Firm—David H. Judson

[57] ABSTRACT

An automatic call distribution (ACD) switching system having a plurality of agent/trunk interface circuits for selectively connecting a plurality of telephone trunks to a plurality of agent workstations. The ACD switching system includes at least a first line interface module having a shelf control module for controlling a plurality of carrier card slots. At least one of the carrier card slots includes a carrier card for supporting a plurality of agent/trunk interface circuit "subcards" in closely-aligned parallel relation to the carrier card. Each carrier card and the shelf control module include digital processing circuits and an HDLC transceiver to facilitate the interconnection of first and second agent/trunk interface circuits upon a call processing request for service. In the preferred embodiment, control information used to effect the interconnection of the agent/-trunk interface circuits is transmitted throughout the switching system in a dedicated timeslot along a digital voice PCM bus. A second line interface module can be provided at a geographically-remote location from the first line interface module for remote processing. The first and second line interface modules are then interconnected via a T-1 span line.

18 Claims, 6 Drawing Sheets

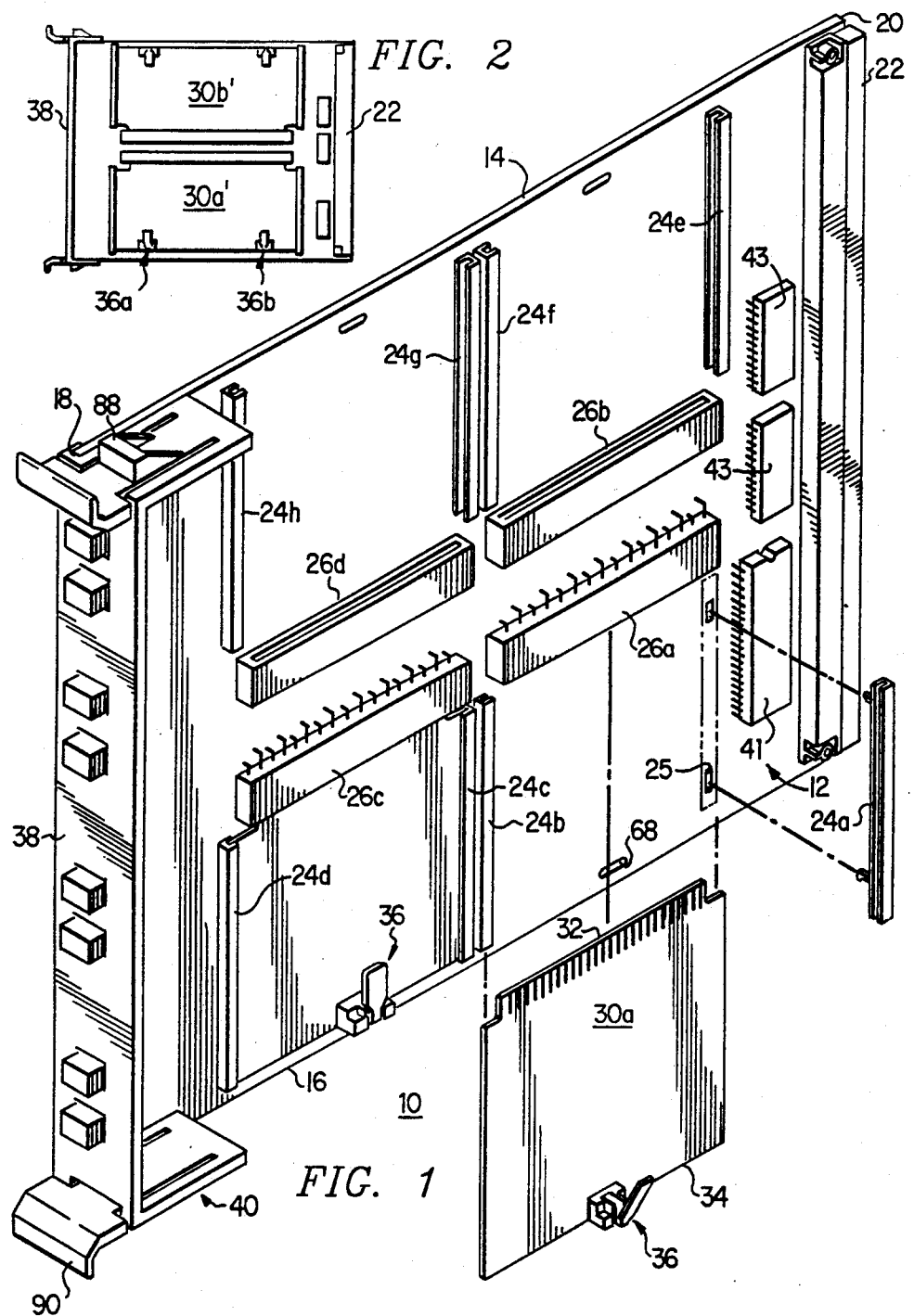

AUTOMATIC CALL DISTRIBUTION (ACD) SWITCHING SYSTEM HAVING DISTRIBUTED PROCESSING CAPABILITY

This application is a continuation-in-part of prior copending application Ser. No. 211,589, filed June 27, 1988 now U.S. Pat. No. 4,840,570.

TECHNICAL FIELD

The present invention relates generally to telecommunications and more particularly to an automatic call distribution (ACD) switching system wherein control functions are distributed throughout the switch to provide increased functionality and to facilitate geographically-distributed ACD network configurations.

BACKGROUND OF THE INVENTION

Automatic call distribution (ACD) systems are well-known in the prior art. These systems typically include a switching system for interfacing a plurality of telephone trunk lines to a plurality of agents each located at a workstation. An ACD system provides distribution of incoming calls to those agents who have been available for the longest period of time. The system queues calls on a first-in, first-out basis if no agents are available to handle an incoming call.

Prior art digital switches for use in automatic call distribution systems typically include a control module, a matrix switch, and a plurality of plug-in or "carrier" card modules which provide an interface to the telephone trunks and the agent workstations. The control module is typically connected directly to each of the carrier card modules via a voice bus and a control bus. While such switches have proven generally reliable, it has not been cost-effective in the prior art to provide significant processing capability on the plug-in carrier card modules. Accordingly, in such systems all call processing activities associated with the telephone ports are controlled by information directed via the control bus between the control module and the various card modules. Such "centralized" control of the switching functions decreases the flexibility of the ACD system.

There is therefore a need for an automatic call distribution switching system which obviates such centralized control of switching functions and which provides substantial modularity and distributed processing capability across all levels of the ACD switching system.

BRIEF SUMMARY OF THE INVENTION

It is therefore an object of the present invention to provide an automatic call distribution (ACD) switching system which exhibits a distributed processing architecture.

It is yet another object of the invention to provide substantial modularity and increased processing capability at all levels of an ACD switching system.

It is still another object of the invention to provide an automatic call distribution (ACD) switching system which includes geographically-remote switching components.

It is yet a further object of the invention to provide a distributed control hierarchy within an automatic call distribution (ACD) switch wherein information for controlling switch connections is embedded in timeslots of PCM voice and/or data highways.

These and other objects of the invention are achieved in an automatic call distribution (ACD) switching system having a switch control module for controlling a timeslot interchange to selectively connect one of a plurality of telephone trunks to one of a plurality of agent workstations. A plurality of agent/trunk interface circuits are supported in the switching system to interface the trunks to the workstations. Each agent/trunk interface circuit is preferably an individually removable module supported on a plug-in carrier card.

According to the more specific aspects of the invention, the switching system includes a backplane having a timeslot serial bus and a non-timeslot serial bus, the timeslot serial bus connected to the timeslot interchange switch. At least one line interface module (LIM) is supported on the backplane, the line interface module having a shelf control module (SCM) and a plurality of plug-in carrier card slots. The carrier card slots support a plurality of carrier cards each having means for supporting one or more removable agent/trunk interface circuit "subcards". The shelf control module is connected to each of the carrier cards via the non-timeslot serial bus for controlling the operation hereof. The shelf control module and each of the carrier cards are also connected to the timeslot serial bus.

According to one important feature of the invention, each carrier card includes an appropriate control circuit which is responsive to a call processing request for service (e.g., ringing on a trunk or request for an agent) at a first agent/trunk interface circuit, the request for service requiring the first agent/trunk interface circuit be connected to at least a second agent/trunk interface circuit. In response to the request for service, the control circuit of the carrier card generates and then transmits a data packet over the non-timeslot serial bus to the shelf control module. The shelf control module also includes an appropriate control circuit for receiving the data packet from the carrier card and in response thereto generating and then transmitting control information to the switch control module to direct the timeslot interchange switch to establish a connection between the first agent/trunk interface circuit and the second agent/trunk interface circuit.

In one embodiment of the invention, a system control bus is connected between the switch control module and the SCM control circuit of each line interface module to facilitate transmission of the control information between such components directly over the system control bus. In this first embodiment, the SCM control circuit comprises an HDLC transceiver for receiving the data packet from the carrier card, a bus interface circuit connected to the system control bus, and a digital processor, responsive to receipt of the data packet by the HDLC transceiver, for controlling the bus interface circuit to generate and then transmit the control information directly to the switch control module over the system control bus. After the switch control module receives the control information and establishes the connection between the first and second agent/trunk interface circuits, the SCM digital processor controls the HDLC transceiver to transmit/receive digital voice and/or data along the timeslot serial bus in a timeslot associated with the agent/trunk interface circuit. This timeslot is established by the control circuit of the carrier card, which control circuit also includes a digital processor and a HDLC transceiver. In particular, the carrier card HDLC receiver is controlled by the digital processor for assigning the digital voice and/or data to the timeslot associated with the first agent/trunk interface circuit at which the request for service was received. The provision of a digital processor and HDLC transceiver on each of the carrier cards and on each shelf control module provides increased modularity and improved switching operation over prior art digital ACD switching systems.

In a second embodiment of the invention, the control information generated by the SCM upon a call processing request for service is not sent directly to the switch control module via a dedicated control bus. Rather, it has been found that still further advantages are provided over the prior art by transmitting such control information in a dedicated timeslot along the timeslot serial bus located between the timeslot interchange switch and the line interface modules of the switching system. In this embodiment, the SCM control circuit comprises an HDLC transceiver for receiving the data packet from the carrier card, a bus interface circuit connected directly to the timeslot serial bus, and a digital processor, responsive to receipt of the data packet by the HDLC transceiver, for controlling the bus interface circuit to transmit the control information over the timeslot serial bus through the timeslot interchange switch to the switch control module. After the switch control module receives the control information and establishes the connection between the first and second agent/trunk interface circuits, the SCM digital processor controls the HDLC transceiver therein to transmit/receive digital voice and/or data along the timeslot serial bus in the timeslot uniquely associated with the agent/trunk interface circuit.

The present invention also facilitates the placement of line interface modules at locations remote from the switch control module and the backplane of the ACD switching system. In the preferred embodiment of the invention, one of the carrier card slots of a first line interface module supports a T-1 span line interface circuit for interfacing signals on the line interface module to a T-1 span line. A second line interface module of the ACD is then located at a geographically-remote location from the backplane of the ACD switching system. The second line interface module also includes a T-1 span line interface circuit. The first and second line interface modules are then interconnected via a T-1 span line. This architecture facilitates the provision of geographically-distributed network configurations over T-1 highways external to the physical ACD switch itself. In this manner, all primary incoming call activity for a remote shelf is terminated either directly within the remote shelf or at the main switch control module.

The foregoing has outlined rather broadly the more pertinent and important features of the present invention in order that the Detailed Description that follows may be better understood and such that the present contribution to the art can be more fully appreciated. Additional features of the invention will be described hereinafter which form the subject of the claims of the invention.

BRIEF DESCRIPTION OF THE DRAWINGS

For a more complete understanding of the nature and objects of the present invention, reference should be made to the following Detailed Description taken in connection with the accompanying Drawings in which:

FIG. 1 is a perspective view of a plug-in carrier card module used in a line interface module of an automated call distribution (ACD) switch according to the present invention;

FIG. 2 is a schematic view of an alternate embodiment of the plug-in carrier card module of FIG. 1 wherein each of the electronic circuit boards supported thereon is oversized;

Similar reference characters refer to similar parts through the several views of the drawings.

DETAILED DESCRIPTION

Figure 3:
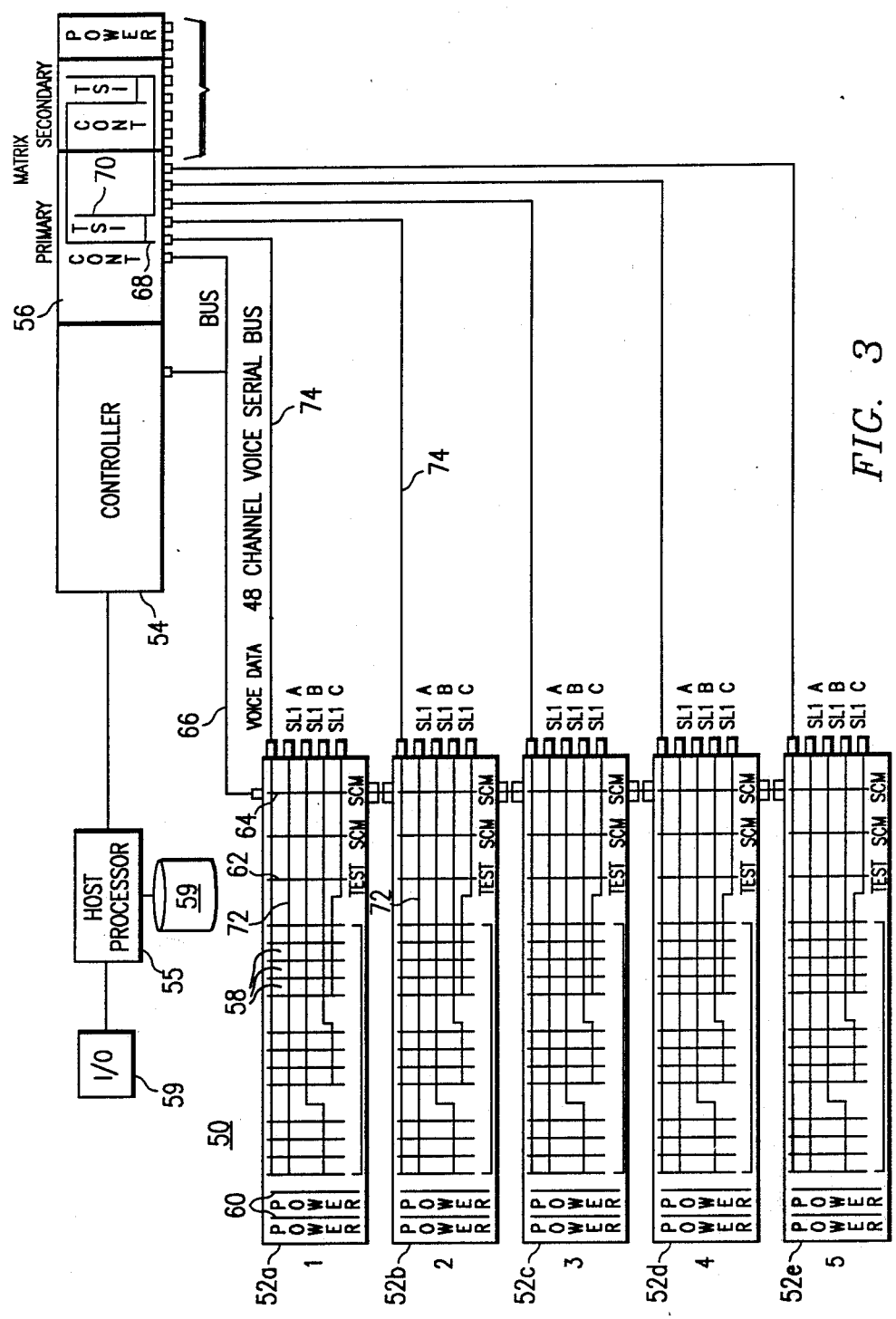
FIG. 3 is a schematic diagram of a first embodiment of an automatic call distribution (ACD) switching system of the present invention embodying a distributed processing capability.

As is well known in the prior art, an automatic call distributor (ACD) is a switching system that distributes calls automatically between a plurality of telephone trunks and a plurality of agent workstations. The ACD functions as a uniform call arrival distributor as an adjunct to an existing PBX or Centrex system. Referring now to FIG. 1, a plug-in carrier card module 10 for use in an ACD switching system of the present invention is shown. The carrier card 10 comprises a printed circuit board 12 having first and second sides 14 and 16, a leading edge 18 and a rear edge 20. The rear edge supports an elongate socket module 22 of known construction in which are housed sockets adapted to be connected to corresponding terminal strips mounted on a backplane of an automatic call distribution (ACD) switch to be described in more detail below. The plug-in carrier card module includes a plurality of card receiving and guiding rails 24 transversely disposed in pairs on the printed circuit board. Each of the guide rail pairs 24a–b, 24c–d, 24e–f and 24g–h comprise first and second oppositely-disposed elongate rails secured to the printed circuit board 12. Preferably, the printed circuit board includes appropriate slots 25 in which the guide rail 24 is inserted, and each of the guide rails has suitable locking tabs along the bottom surface thereof for securing the guide rail to the printed circuit board following insertion in the slots 25.

The plug-in carrier card module 10 also includes a plurality of electrical connectors 26, with at least two of the electrical connectors, such as connectors 26a and 26b, longitudinally disposed on the printed circuit board 12 in back-to-back and/or side-by-side relation. As seen in FIG. 1, each of the electrical connectors 26 is disposed adjacent an associated pair of elongate guide rails. For example, electrical connector 26a is disposed between the ends of the pair of guide rails 24a and 24b. To provide increased modularity and ease of circuit replacement, the plug-in carrier card 10 includes a plurality of individually-removable electrical circuit boards 30a–d. As will be described in more detail below, the electrical circuit boards comprise a plurality of ACD agent/trunk interface circuits for selectively interfacing a plurality of telephone trunks to a plurality of agent workstations. For example, and not by way of limitation, the ACD interface circuits 30 may include a trunk, agent, voice response or administrative interface, and/or a service circuit such as voice announcement, tone receiver, music or emergency interface. In other embodiments, the ACD interface circuits comprise an answer detection circuit or other digital signal processing circuits. Each electrical circuit board 30 is slidably supported in a pair of elongate guide rails and includes a leading edge 32, to be received in an associated electrical connector, and a rear edge 34 on which is supported a locking mechanism 36 for locking the electrical circuit board 30 in the pair of elongate guide rails and its associated electrical connector. The plug-in carrier card module 10 also includes a faceplate 38 secured by screws or the like to the leading edge 18 of the printed circuit board 12. The faceplate 38 includes an integrally-molded spring release mechanism 40 at each end to facilitate the removal of the card module 10 from the rack module.

While in the preferred embodiment each of the plug-in carrier card modules includes four (4) "piggybacked" electronic circuit boards, this arrangement is not to be taken by way of limitation as any other number of subcards can be suitably supported in back-to-back and/or side-by-side relation on the printed circuit board. Moreover, and with reference briefly to FIG. 2, it may also be desirable to provide one or more oversized electronic circuit boards 30a' and 30b' instead of four (4) smaller boards. In the alternate embodiment of FIG. 2, each of the electronic circuit boards supports first and second locking mechanisms 36a and 36b substantially as shown. Of course, a plug-in card module may also be provided with two standard size electronic circuit boards on one half of the module and one oversized circuit board on the other half thereof.

It should be appreciated that the "piggybacked" structures shown in FIGS. 1 and 2 provide substantial benefits over prior art ACD plug-in card modules where each such module included all electronics on the printed circuit board itself. The use of small, modular electrical circuit boards stacked to a printed circuit board advantageously enables maintenance and/or repair of defective components without replacement of an entire module which might otherwise be fully operational. Moreover, the modularity of the plug-in carrier card module enables each agent/trunk interface "subcard" as well as the carrier card itself to be provided with a higher degree of processing capability because of the relatively lower cost of manufacturing each subcard vis-a-vis the cost of prior art printed circuit boards. Further, by providing modularity at the port level, the carrier card supports its own processing capability as represented by the digital processor 41 and associated memory, and a control device 43 as will be discussed with respect to FIG. 6. As will also be described, the control device 43 comprises a high level data link control ("HDLC") transceiver circuit which is controlled by the digital processor 41 to provide operating efficiencies over the prior art. The limitations of prior art ACD switches, namely, the inability to economically provide significant processing capability on the carrier card itself, are therefore overcome by the plug-in carrier card module of the present invention.

The plug-in carrier card module 10 facilitates the use of a distributed processing hierarchy in an automatic call distribution (ACD) switching system which has not heretofore been achieved. In particular, by enabling high level processing capabilities to be located on the carrier card PCB and/or the agent/trunk interface subcards themselves, the disclosed plug-in carrier card module allows switch control functions to be distributed across at least a four-level hierarchy comprising (1) an overall switch control module at the highest level, (2) a shelf control module (or "SCM") at an immediate level for controlling the plug-in carrier cards on a shelf of the ACD switch, (3) the plug-in carrier card itself at a next intermediate level, and (4) an agent/trunk interface circuit (i.e., subcard) at the lowest level of the hierarchy.

This distributed processing hierarchy is represented schematically in FIG. 3. An ACD switching system 50 according to the invention includes a plurality of line interface modules ("LIM's") 52a-52e, a main switch control module 54 and a matrix or timeslot interchange switch 56. Each LIM includes means for supporting a plurality of the plug-in modules or "carrier cards" of FIG. 1. Although not shown in detail, the support means preferably includes a conventional rack module or "card cage" including a plurality of slots 58 for supporting the carrier cards 10 in an abutting side-by-side relation. Each line interface module 52 includes first and second power modules 60, the carrier cards 10, a test card 62 and first and second shelf control modules ("SCM's") 64 for controlling the operation of the carrier cards as will be described. The shelf control modules are, in this embodiment, directly connected to the switch control module via a system input/output bus 66. As seen in FIG. 3, the system bus 66 is also connected to the matrix switch 56.

The ACD switching system 50 performs digital call switching functions under the control of the switch control module 54 and matrix switch 56. The switch control module 54 controls the scanning of incoming trunk lines for calls, interprets function requests from the agent instruments, provides instructions for the interconnection of lines-to-agents, and reports call activity to a host processor 55 having associated storage 57 and input/output devices 59. The host processor 55 provides network management for monitoring and recording call activity in the ACD system. As seen in FIG. 3, the timeslot interchange switch components, shelf control module and line interface module power circuit all have primary and secondary (i.e., redundant) cards for increased system reliability and decreased system downtime. In operation, switchover from the primary component to the redundant or backup component occurs in such a manner that calls in progress which are affected by the failed component will not be disrupted.

The timeslot interchange switch 56 decodes the interconnect instructions from the switch control module 54 and completes the voice path between the incoming lines and the agent instruments. In particular, the timeslot interchange switch 56 includes a matrix controller card 68 which translates addresses and commands received from the line interface modules into parallel code information. This information is then sent to a timeslot interchange ("TSI") card 70 which decodes the parallel code from the matrix controller 68, finds the appropriate address location, and makes the appropriate interconnection.

At least one line interface module 52 contains the carrier cards 10 and agent/trunk interface subcards 30 necessary to interface the telephone lines and agent instruments to the system. As will be described in more detail below, the shelf control modules 64 in each LIM are connected to each of the carrier cards 10 therein via a non-timeslot serial bus 72 for controlling the operation of the carrier cards. The shelf control modules 64 and each of the carrier cards 10 of a line interface module are also connected to a preferably 48 channel voice timeslot serial bus 74. The timeslot serial bus is adapted to transmit/receive digital voice in a conventional pulse code modulated (PCM) format between the line interface module and the timeslot interchange switch 56.

According to one important feature of the invention as will be described, each carrier card 10 includes an appropriate control circuit which is responsive to a call processing request for service (e.g., ringing on a trunk, request for an agent, request for voice announcement music "on-hold", agent requests call placement, etc.) at an agent/trunk interface circuit 30 for generating a data packet and then transmitting the data packet over the non-timeslot serial bus 72 to the primary shelf control module 64 in the ling interface module in which the agent/trunk interface circuit 30 is supported. The shelf control module 64 also includes an appropriate control circuit for receiving the data packet from the carrier card 10 and in response thereto generating and then transmitting control information to the switch control module 54 via the system bus 66. The control information is derived from the data packet and enables the switch control module 54 to direct the timeslot interchange switch to connect the agent/trunk interface circuit 30 to one or more other agent/trunk interface circuits in the system. After the switch control module 54 receives the control information and controls the switch 56 to establish the connection between the agent/trunk interface circuit (at which the request for service was received) and the one or more other agent/trunk interface circuits, the SCM 64 controls the transmission and/reception of the PCM voice and/or data along the timeslot serial bus 74 in a timeslot uniquely associated with the agent/trunk interface circuit 30 at which the request for service was initiated. According to a feature of the invention, this timeslot is established by the control circuit of the carrier card 10 which supports the initiating agent/trunk interface circuit.

Figure 4:
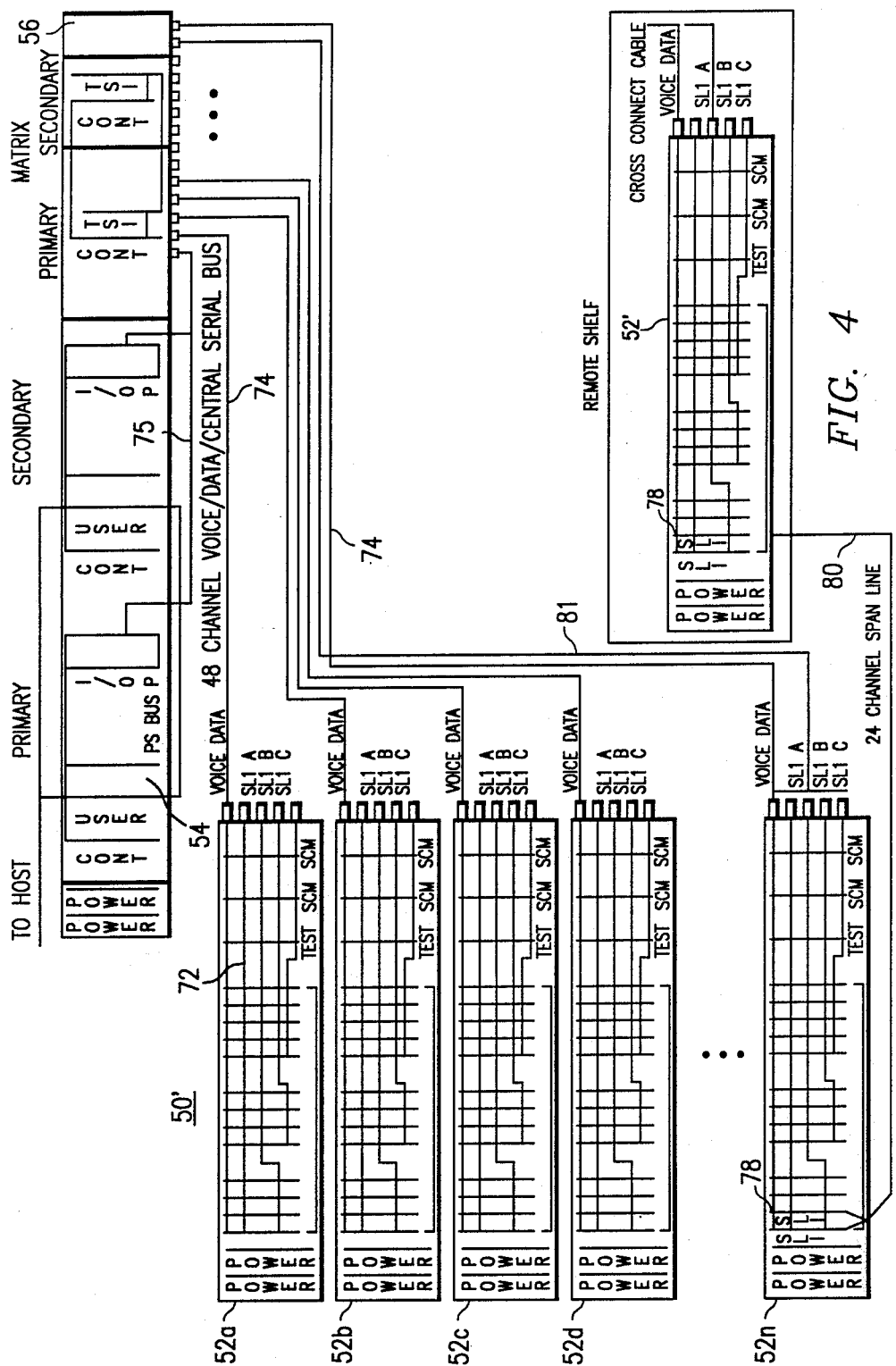
FIG. 4 is a schematic diagram of a preferred embodiment of the ACD switching system of the present invention.

In a preferred embodiment of the invention as now shown in FIG. 4, the control information generated upon a call processing request for service is not sent directly to the switch control module 54 via the dedicated control bus 66. Rather, it has been found that still further advantages are provided over the prior art by transmitting such control information in a dedicated timeslot along the timeslot serial bus 74 located between the matrix switch and the line interface modules of the switching system 50'. Referring specifically to FIG. 4, wherein like reference characters designate similar parts with respect to FIG. 3, the switching system 50' includes a plurality of line interface modules 52a–52n each of which are connected only to the switch 56 via a 48 channel voice/data/control timeslot serial bus 74. The switch is controlled by the switch control module 54 via control information provided over bus 75. The switch control module preferably includes redundant card components substantially as shown.

In the preferred embodiment of the invention as shown in FIG. 4, each carrier card 10 again includes an appropriate control circuit which is responsive to a call processing request for service at an agent/trunk interface circuit 30 for generating a data packet and transmitting the data packet over the non-timeslot serial bus 72 to the primary shelf control module 64 in the line interface module in which the agent/trunk interface circuit 30 is supported. The SCM control circuit receives the data packet and in response thereto generates the necessary control information. The SCM control circuit then places the control information into a dedicated timeslot along the PCM highway 74 for transmission to the switch control module 54 via the timeslot interchange switch 56. After the switch control module 54 receives the control information and controls the timeslot interchange switch 56 to establish the connection between the agent/trunk interface circuit (at which the request for service was received) and the one or more other agent/trunk interface circuits, the SCM controls the transmission and reception of the digital voice and/or data along the timeslot serial bus 74 in the timeslot associated with the originating agent/trunk interface circuit.

The use of dedicated timeslots along the PCM highway 74 for transmitting/receiving control information is highly advantageous and provides improved operating efficiencies over prior art ACD switching systems. This operation facilitates the placement of line interface modules at locations remote from the backplane of the ACD switching system. As seen in FIG. 4 for example, two of the carrier card slots 10 of the line interface module 52n include first and redundant T-1 span line interface ("SLI") circuits 78 for interfacing signals in the ling interface module to a 24 channel T-1 span line 80. In this embodiment, a span line timeslot serial bus 81 is also connected between the LIM 52n and the timeslot interchange switch 56. At least one of the line interface modules 52' of the ACD switching system 50' is then located at a geographically-remote location from the backplane of the ACD switch. The line interface module 52' located at the geographically-remote location also includes a span line interface circuit 78 which is connected to the T-1 span line interface circuits 78 of LIM 52n via the T-1 span line 80. This architecture facilitates the providing of geographically-distributed configurations over T-1 highways external to the physical ACD switch itself, while communications within the backplane of the system are PCM-based.

In the preferred embodiment, the span line interface circuit is an Integrated Services Digital Network ("ISDN") compatible option which allows connection to T-1 or CEPT transmission networks. As seen in FIG. 4, the SLI circuits provide connections for 24 T-1 or 32 CEPT full duplex digital voice and/or data channel ports. The SLI circuits convert these channels to a standard time division multiplexed (TDM) PCM highway.

Figure 5:
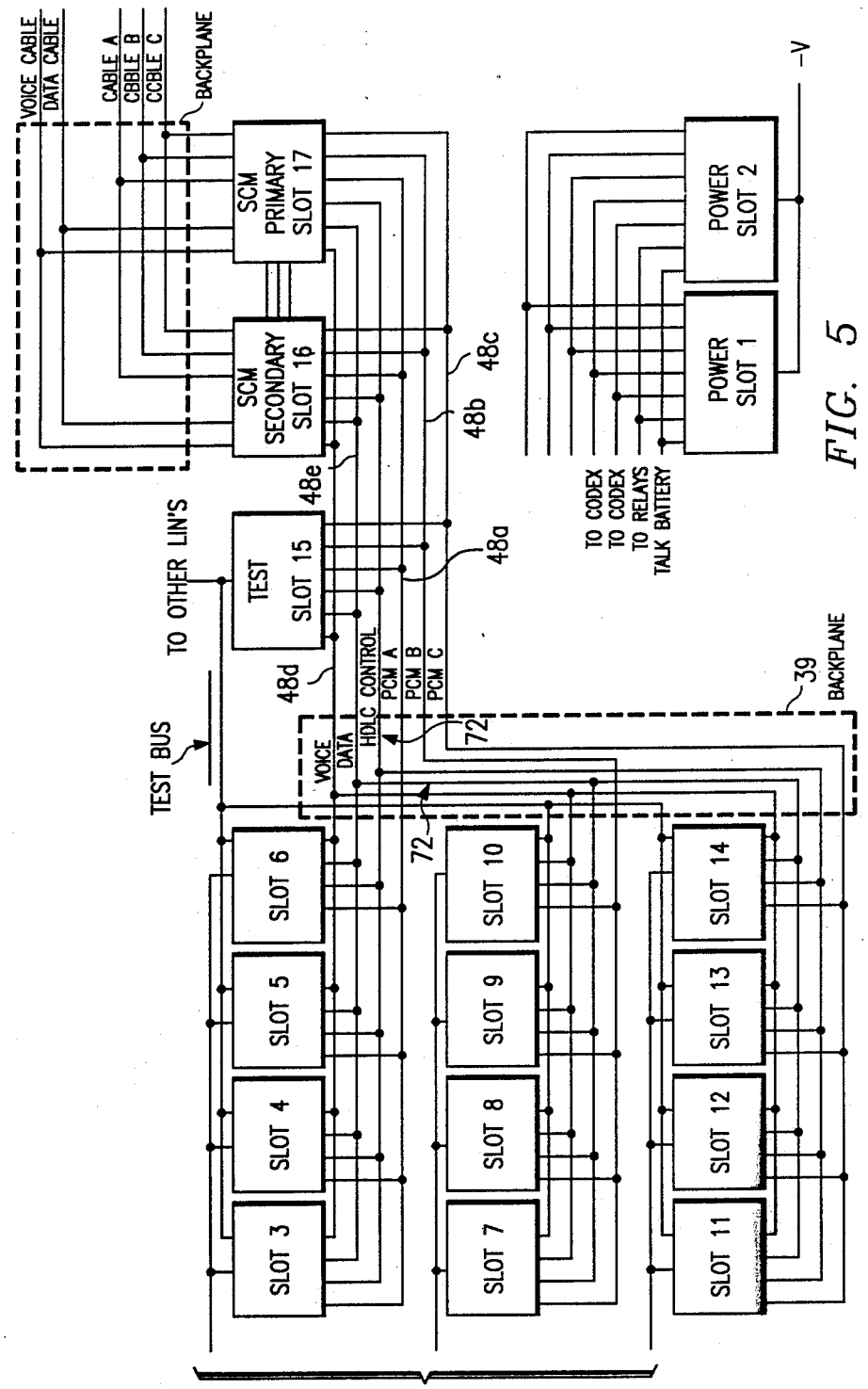
FIG. 5 is a detailed schematic diagram of the line interface module backplane of the ACD switch of FIG. 4.

Referring now to FIG. 5, a schematic diagram is shown of a preferred backplane architecture for each line interface module 52 of the ACD switching system of FIG. 4. Preferably, the backplane 39 includes first, second and third span line interface (SLI) timeslot serial buses 84a, 84b and 84c connected between the switch 56 and each of the SCM circuits 64. A voice timeslot serial bus 84d and a data timeslot serial bus 84e are also connected to the SCM circuits as shown. The line interface module supports the plurality of carrier cards and/or SLI circuits in slots arranged in first, second and third sets, the first set of carrier card slots (slots 3–6) connected to the first SLI timeslot serial bus 84a, the second set of carrier card slots (slots 7–10) connected to the second SLI timeslot serial bus 84b and the third set of carrier card slots (slots 11–14) connected to the third SLI timeslot serial bus 84c. Each of the carrier card slots is also connected to the non-timeslot serial bus 72, for enabling the SCM to control each of the carrier cards in the LIM, and also to both the voice and data timeslot serial buses 84d and 84e. The backplane also includes built-in redundancy lines between each pair of slots on the backplane. By organizing the backplane in this manner, the ACD switching system provides maximum utilization of carrier card and line interface module processing capability. This structure further facilitates the use of higher level processing circuits in the LIM (e.g., an SLI circuit) which would not otherwise be possible using conventional backplane structures.

Figure 6:
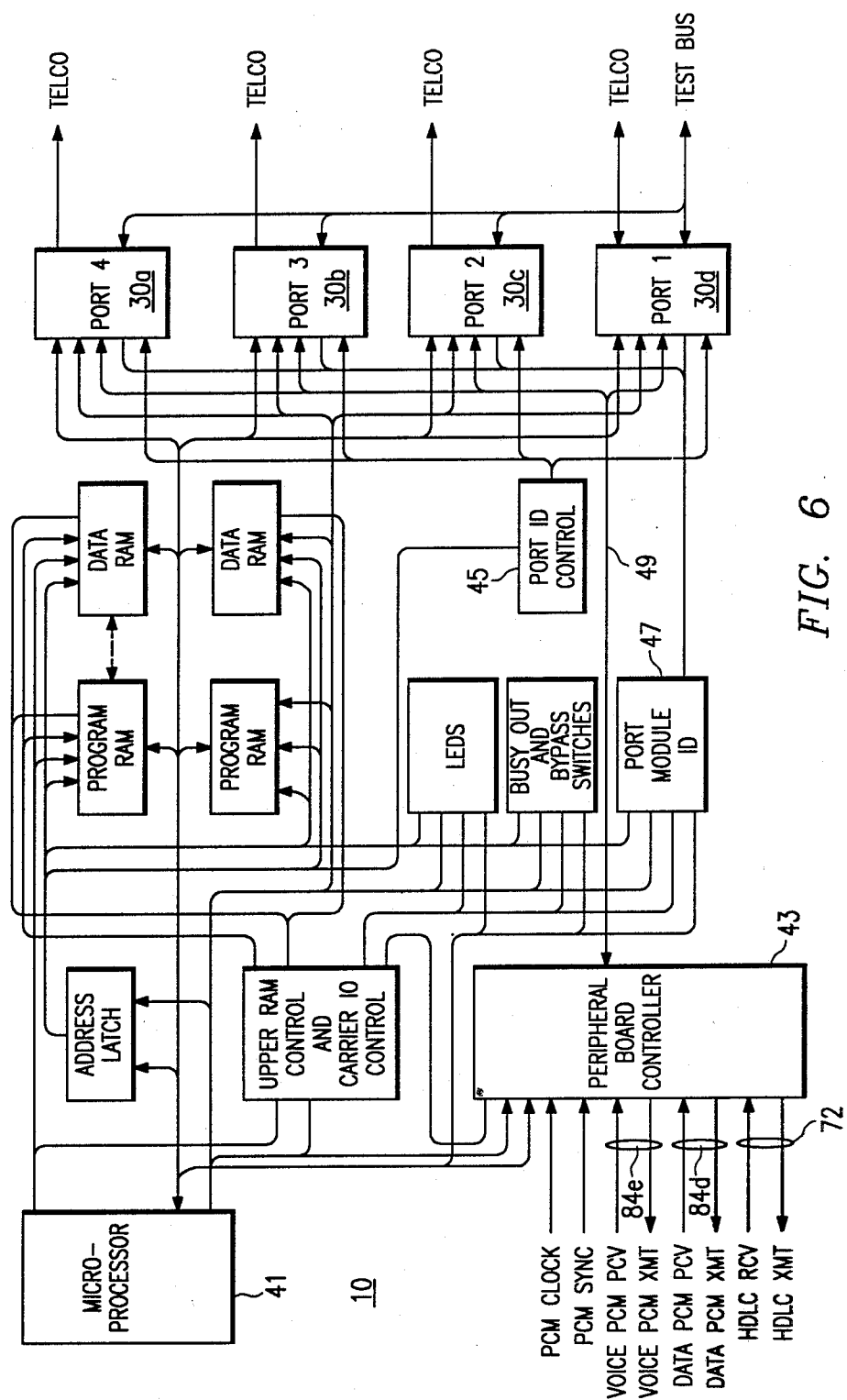
FIG. 6 is a detailed schematic diagram of one of the carrier cards of the line interface module of FIG. 5.

Referring now to FIG. 6, a detailed schematic diagram is shown of a representative carrier card 10 of the present invention. As described above with respect to FIG. 1, the carrier card 10 includes means for supporting the one or more of the agent/trunk interface circuits for selectively interfacing the telephone trunks to the agent workstations. The carrier card includes a control circuit comprising the digital processor 41 and the high level data link circuit (HDLC) transceiver 43. The HDLC transceiver 43 or "peripheral board controller" is preferably a type PEB2050 integrated circuit which is controlled by the digital processor 41 for assigning each of the associated ports 30a-30d on the carrier card to a dedicated timeslot along one or both of the timeslot voice and data buses 84d and 84e. For example, port 30a (i.e., slot 4) is assigned one timeslot of the 48 channel bus 84d, port 30b is assigned another timeslot of the bus 84d, and so forth.

The control circuit of the carrier card also advantageously generates and transmits a data packet via the non-timeslot bus 72 to the SCM 64 upon a call processing request for service. A call processing request for service requires interconnection of agent/trunk interface circuits to facilitate some call processing activity. The data packet generated by the HDLC transceiver 43 is transmitted to the SCM 64 to enable the request for service to be carried out. As also seen in FIG. 6, the carrier card control circuit further includes a port I/O control 45 for enabling the digital processor 41 to talk directly to the ports 30, as well as a port module ID 47 for reading static bits from a port subcard. The carrier card 10 also includes a serial bus 49 between the peripheral board controller and each port card for providing all voice, data and control communications between these components.

Figure 7:
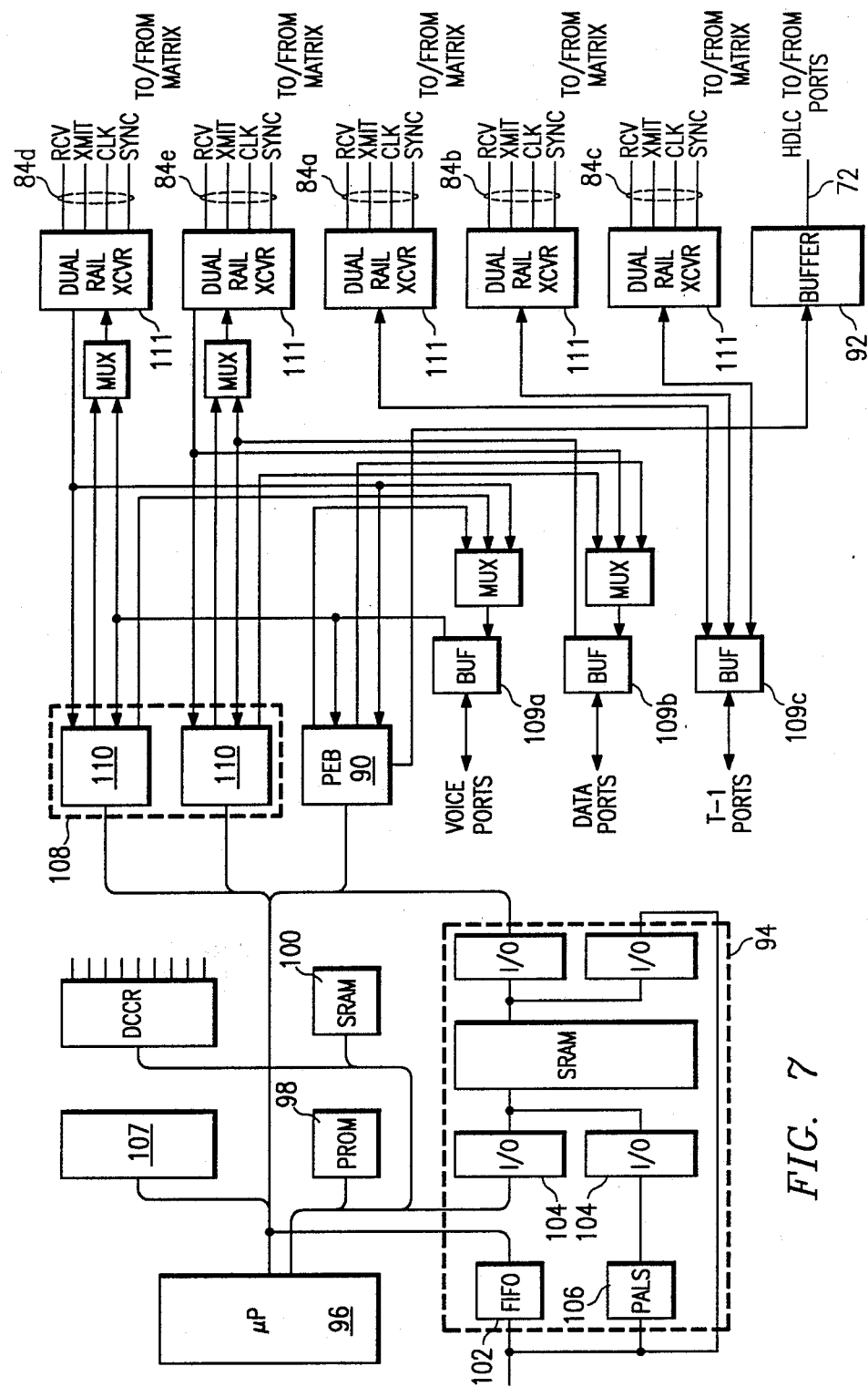
FIG. 7 is a detailed schematic diagram of a primary shelf control module of the line interface module of FIG. 5.

Referring now to FIG. 7, the control circuit of the SCM 64 is shown for use in both embodiments of the ACD switching system shown in FIGS. 3 and 4. The SCM control circuit includes an HDLC transceiver 90 (i.e., a type PEB2050 circuit) for receiving the data packet from the carrier card 10 through a buffer circuit 92, a bus interface circuit 94 connected to the control bus 66 of the switching system, and a digital processor 96 and associated memory devices 98 and 100 for storing suitable control programs and data for use in controlling the operation of the control circuit. The bus interface circuit 94 is only used in the embodiment of FIG. 3 and includes a FIFO memory 102, suitable input/output buffers 104 and a programmable array logic circuit 106. An interrupter processor 107 operates in conjunction with the digital processor. The bus interface circuit 94 functions generally to receive all data and function information from the system bus 66 as well as data packets generated from the carrier cards on the shelf. Voice data and T-1 communications between the SCM and the carrier cards 10 and/or SLI circuits are provided through the buffer circuits 109a, 109b and 109c.

In the ACD switching system of FIG. 4, the bus interface circuit 94 is not used or omitted and a bus interface circuit 108 is provided for connection directly to the timeslot serial bus. The bus interface circuit 108 comprises two Siemens 82520 dual channel HDLC transceivers 110 which are connected to the voice and data PCM serial buses 84d and 84e as shown in FIG. 7. The first, second and third SLI timeslot serial buses 84a, 84b and 84c are connected to buffer circuit 109c. All of the serial buses 84 are connected to dual rail transceivers 111 for converting the unbalanced bus signals to differential signals.

The HDLC transceivers 110 function to program control information into any of the 48 timeslots within the PCM voice and/or data highways. Preferably, the control information is provided in the 48th timeslot of the voice bus. One transceiver channel of each unit 110 may communicate with the timeslots terminating at the carrier card slots and the other channel with the switch 56. As noted above, the Siemens PEB2050 peripheral controller 90 controls the HDLC interface with the carrier cards associated with the SCM. The data packets to/from the carrier cards are sent and received along the non-timeslotted bus 72. In particular, destinations within the shelf are all polling the data on the bus 72, looking for address information contained in each frame. An HDLC frame consists of a start flag, address field, control field, information field, CRC check sum field and an end flag. Carrier card ports transmit on the bus 72 only when queried by the SCM.

In operation of the FIG. 3 embodiment, the digital processor 96 is responsive to receipt of a request for service data packet by the HDLC transceiver 90, for controlling the bus interface circuit 94 to transmit the control information directly to the switch control module 54 over the control bus 66. In the preferred embodiment of FIG. 4, the digital processor 96 is responsive to receipt of the data packet by the HDLC transceiver 90 for controlling the bus interface circuit 108 to transmit the control information over the timeslot serial bus through the timeslot interchange switch 56 to the switch control module 54. The provision of a digital processor and HDLC transceiver 90 on each of the carrier cards and on each shelf control module provides increased modularity and improved switching operation over prior art digital ACD switching systems.

Therefore, according to the present invention, the communications structure within the ACD is timeslot serialbased, with voice path communications between physical shelves handled over PCM highways. Voice path communications between remote shelves and/or large networks (involving multiple ACD's) occur over T-1 highways in the configuration described above in FIG. 4. T-1 highways could also be provided internally between shelves of the switching system.

In the preferred embodiment, a single ACD supports well over two thousand (2000) user definable ports. These universal ports are housed across up to 10 shelves, each supporting 48 to 144 ports. Because communications between shelves are T-1 based, geographically-distributed configurations can be designed such that 24 port increments may be located in different facilities/cities and connected to the core call processing switch control module via the T-1 highways. All of the primary incoming call activity for the remote operation may be terminated directly within the distant shelf.

Or, all incoming traffic may be terminated at the switch control module of the central call center facility, and the T-spans carry the traffic to the agents in the remote location.

Call are distributed to agents in a centralized configuration on the basis of priority and longest waiting within the priority. When a call enters the ACD, it is assigned to a Routing Table. Within the Routing Table are instructions as to how the call should be processed. One of the first steps within the route will indicate the priority of the calls to be processed by the route. There are preferably a total of five (5) priority levels for incoming calls. A Routing Table also indicates the Agent Group (s) to search in selecting an available agent to handle the call. Sophisticated routing tables may be structured to expand the search for an available agent to multiple groups as well as to increase the priority level. These expansions are usually invoked after a period of delay has been exceeded without an agent becoming available. Thus, as time in queue increases, the number of agents to search for can increase as can the priority level. When an agent becomes free, the ACD selects the call that has been waiting the longest within the highest priority group and assigns that call to the agent. The duration in queue is based upon the time the call actually arrives and does not reinitialize as priority levels are incremented.

When remote facilities are provided as in FIG. 4 by distancing a 24 or 48 port shelf, call processing is handled identically as if the shelf was within the backplane of the center. Similarly, if a second ACD is remote from the main call center, it is possible to process calls to agents in the remote facility as if they were housed in the main center. For example, Routing tables can be designed to search for an available agent in the main facility and, after a period of time, overflow the call to another facility/city. In the overflow condition, the search for an available agent continues in both the main and remote facility. Once an overflow point is reached, call processing offers the call to the remote facility over the dedicated T-1 line. This overflow condition causes the T-1 line to signal the distant ACD shelf with the Routing Table to use in processing the call. As such, priorities can be used to handle call distribution to available agents on an equitable scheme.

By way of example only, assume a Customer Service call enters the network in City A with a priority of 1. After 10 seconds, the search for an available agent is expanded to include a backup group of agents. Then, after 10 additional seconds, the priority is increased to 2 and the call is offered to City B where a second ACD shelf resides. When the call arrives at City B, a route is specified that processes the call beginning at the priority 2 level and looks for any available agent in either the Customer Service group or its backup. As a priority 2 call, the call from City A will be handled over any local calls in City B that have been waiting less than 20 seconds (i.e. assuming City B local calls maintain a priority 1 level for the first 20 seconds in queue). However, any local City B calls that have been waiting more than 20 seconds can be escalated to priority 2 and serviced accordingly with the City A arrival. The overflow structure of calls from City B to City A can be designed via Routing Tables to offer the same equal distribution amongst the City A agents based upon longest call waiting within the highest priority level.

As noted above, the ACD switching system of the present invention is compatible with Integrated Services Digital Network (ISDN) specifications. In particular, the ACD backplane is ideally suited for an ISDN basic rate interface due to the structure of the voice and data timeslot serial buses and the non-timeslot serial bus connected between the SCM and the carrier cards on each line interface module. The SCM has the capability to process ISDN basic rate interface delta or "D" channels. Likewise, the use of HDLC control information embedded in timeslots along the PCM timeslot serial bus is ideally suited for processing ISDN primary rate interface "D" channels. Specifically, the primary rate of ISDN T-1 consists of 23 "B" channels and a "D" channel of 64 Kb/sec. The provision of a dedicated timeslot for control information interconnecting both the SCM control circuitry and the timeslot interchange switch facilitates networking of ACD switches and remote line interface modules through primary rate ISDN /with the "D" channel used for internetworking control information and the interconnection of the ACD switch with an ISDN public network.

The present invention provides significant advantages and operating efficiencies as compared to prior art ACD digital switching systems wherein control functions are wholly centralized in the switch control module. Indeed, with the provision of digital processing capability at the shelf (i.e., SCM) level and the carrier card/port level as described hereinabove, the ACD switching system of the present invention also exhibits the capability of shifting or "off-loading" control functions, normally associated with the switch control module, down to the shelf and/or carrier card level. This off-loading of functions, particularly those which are highly repetitive such as maintaining scanning functions and monitoring state changes in the status of the carrier cards, significantly reduces the message traffic on the datalink between the timeslot interchange and the line interface modules. Therefore, the switch control module is relieved of the more repetitive switch functions and thus becomes more of a higher level executive control. As a by-product, the switch control module can handle much larger numbers of line interface modules to create a much larger switch. Further, this shift of call processing to the SCM provides for remote distributed switch control functions when a line interface module is remotely located from the switch control module. The remote LIM in effect then becomes a remote switch unit instead of merely a remote agent/trunk unit.

It should be appreciated by those skilled in the art that the conception and the specific embodiment disclosed mag be readily utilized as a basis for modifying or designing other structures for carrying out the same purposes of the present invention. It should also be realized by those skilled in the art that such equivalent constructions do not depart from the spirit and scope of the invention as set forth in the appended claims.

We claim:

1. An automatic call distribution (ACD) switching system having a switch control module for controlling a timeslot interchange switch to selectively connect one of a plurality of telephone trunks to one of a plurality of agent workstations, comprising:
   a plurality of agent/trunk interface circuits for interfacing the telephone trunks to the agent workstations;
   a backplane having a timeslot serial bus connected to the timeslot interchange switch, and a non-timeslot serial bus;

a first line interface module (LIM) supported on the backplane and having a shelf control module (SCM) and a plurality of carrier cards connected to the timeslot serial bus and the non-timeslot serial bus, the carrier cards having means for supporting one or more of the agent/trunk interface circuits;

control means supported on each carrier card an responsive to a call processing request for service at a first agent/trunk interface circuit on the carrier card for generating a data packet and transmitting the data packet over the non-timeslot serial bus to the shelf control module, the call processing request for service requiring the first agent/trunk interface circuit be connected to a second agent/trunk interface circuit; and control means supported on the shelf control module for receiving the data packet from the carrier card and in response thereto transmitting control information to the switch control module to enable the switch control module to direct the timeslot interchange to establish a connection between the first agent/trunk interface circuit and the second agent/trunk interface circuit.

2. The automatic call distribution (ACD) switching system as described in claim 1 further including:

a system control bus connected between the switch control module and the control means supported on the shelf control module for transmitting the control information therebetween.

3. The automatic call distribution (ACD) switching system as described in claim 2 wherein the control means of the shelf control module comprises:

a high level data link control (HDLC) transceiver for receiving the data packet from the carrier card;

a bus interface circuit connected to the system control bus; and a digital processor responsive to receipt of the data packet by the HDLC transceiver for controlling the bus interface circuit to generate and transmit the control information directly to the switch control module over the system control bus.

4. The automatic call distribution (ACD) switching system as described in claim 3 wherein the control means of the carrier card comprises:

a digital processor responsive to the call processing request for service at the first agent/trunk interface circuit for generating the data packet; and a high level data link control (HDLC) transceiver controlled by the digital processor of the carrier card for transmitting the data packet over the non-timeslot serial bus and for assigning a timeslot on the timeslot serial bus to the first agent/trunk interface circuit, the timeslot for transmitting/receiving digital voice and/or data to/from the first agent/trunk interface circuit.

5. The automatic call distribution (ACD) switching system as described in claim 4 wherein the digital processor of the shelf control module is responsive to connection of the first agent/trunk interface circuit to the second agent/trunk interface circuit for controlling the HDLC transceiver of the shelf control module to transmit/receive digital voice and/or data along the timeslot serial bus in the timeslot associated with the first agent/trunk interface circuit.

6. The automatic call distribution (ACD) switching system as described in claim 1 wherein the control means of the shelf control module comprises:

a high level data link control (HDLC) transceiver for receiving the data packet from the carrier card;

a bus interface circuit connected to the timeslot serial bus; and a digital processor responsive to receipt of the data packet by the HDLC transceiver for controlling the bus interface circuit to generate and transmit the control information over the timeslot serial bus through the timeslot interchange switch to the switch control module.

7. The automatic call distribution (ACD) switching system as described in claim 6 wherein the control means of the carrier card comprises:

a digital processor responsive to the call processing request for service at the first agent/trunk interface circuit for generating the data packet; and an HDLC transceiver controlled by the digital processor of the carrier card for transmitting the data packet over the non-timeslot serial bus and for assigning a timeslot on the timeslot serial bus to the first agent/trunk interface circuit, the timeslot for transmitting/receiving digital voice and/or data to/from the first agent/trunk interface circuit.

8. The automatic call distribution (ACD) switching system as described in claim 7 wherein the digital processor of the shelf control module is responsive to connection of the first agent/trunk interface circuit to the second agent/trunk interface circuit for controlling the HDLC transceiver of the shelf control module to transmit/receive digital voice and/or data along the timeslot serial bus in the timeslot associated with the first agent/trunk interface circuit.

9. The automatic call distribution (ACD) switching system as described in claim 1 wherein a first line interface module includes a T-1 span line interface circuit for interfacing digital voice and/or data in the first line interface module to a T-1 span line.

10. The automatic call distribution (ACD) switching system as described in claim 9 further including a second line interface module located at a geographically-remote location from the backplane of the switching system, the second line interface module including a T-1 span line interface circuit.

11. The automatic call distribution (ACD) switching system as described in claim 10 wherein the span line interface circuits of the first and second line interface modules are connected via a T-1 span line.

12. The automatic call distribution (ACD) switching system as described in claim 1 further including network management means connected to the switch control module for monitoring and recording operations of the switching system.

13. The automatic call distribution (ACD) switching system as described in claim 6 wherein the transmission of control information over the timeslot serial bus is compatible with an ISDN primary rate "D" channel and the shelf control module and the backplane are compatible with the ISDN basic rate "D" channel to facilitate interconnection of a network of remote line interface modules to the switch control module or interconnection of the ACD switching system to an ISDN public network.

14. An automatic call distribution (ACD) switching system having a switch control module for controlling a timeslot interchange switch to selectively connect one of a plurality of telephone trunks to one of a plurality of agent workstations, comprising;

a backplane having a voice timeslot serial bus and first, second and third span line interface (SLI) timeslot serial buses connected to the timeslot interchange switch; and a first line interface module (LIM) supported on the backplane and having a plurality of carrier card slots arranged in first, second and third sets, the first set of carrier card slots connected to the first SLI timeslot serial bus, the second set of carrier card slots connected to the second SLI timeslot serial bus, and the third set of carrier card slots connected to the third SLI timeslot serial bus.

15. The automatic call distribution (ACD) switching system as described in claim 14 further including a second line interface module located at a geographically-remote location from the backplane of the switching system and having a plurality of carrier card slots.

16. The automatic call distribution (ACD) switching system as described in claim 15 wherein each of the first and second line interface modules support a span line interface circuit in one of the carrier card slots.

17. The automatic call distribution (ACD) switching system as described in claim 15 wherein the span line interface circuits of the first and second line interface modules are interconnected via a T-1 span line.

18. In an automatic call distribution (ACD) switching system having a switch control module for performing a plurality of control functions which control a timeslot interchange switch to selectively connect one of a plurality of telephone trunks to one of a plurality of agent workstations, the improvement comprising:

at least one line interface module (LIM) having a shelf control module (SCM) and a plurality of carrier cards, each of the carrier cards having means for supporting one or more agent/trunk interface port cards for interfacing the telephone trunks to the agent workstations;

control means including a digital processor supported on each carrier card for controlling the agent/trunk interface port cards on the carrier card; and control means including a digital processor supported on the shelf control module for performing one or more of the control functions of the switch control module to thereby control the carrier cards on the line interface module.

* * * * *